(12) United States Patent
Cho et al.

(10) Patent No.: US 11,117,086 B2
(45) Date of Patent: Sep. 14, 2021

(54) APPARATUS FOR COLLECTING BY-PRODUCT OF SEMICONDUCTOR MANUFACTURING PROCESS

(71) Applicant: MILAEBO CO., LTD., Pyeongtaek-si (KR)

(72) Inventors: Che Hoo Cho, Seongnam-si (KR); Jae Jun Lee, Hwaseong-si (KR); Myung Pil Han, Yongin-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 97 days.

(21) Appl. No.: 16/677,621

(22) Filed: Nov. 7, 2019

(65) Prior Publication Data
US 2021/0039034 A1 Feb. 11, 2021

(30) Foreign Application Priority Data
Aug. 8, 2019 (KR) .................. 10-2019-0096584

(51) Int. Cl.
| | | |
|---|---|---|
| *B01D 50/00* | (2006.01) | |
| *C23C 16/44* | (2006.01) | |
| *B01D 46/24* | (2006.01) | |
| *B01D 45/08* | (2006.01) | |
| *H01L 21/67* | (2006.01) | |
| *B08B 15/02* | (2006.01) | |

(52) U.S. Cl.
CPC .......... *B01D 50/002* (2013.01); *B01D 45/08* (2013.01); *B01D 46/24* (2013.01); *C23C 16/4412* (2013.01); *B08B 15/023* (2013.01); *H01L 21/67017* (2013.01); *H01L 21/67207* (2013.01)

(58) Field of Classification Search
CPC ...... B01D 50/002; B01D 46/24; B01D 45/08; C23C 16/4412; H01L 21/67017; H01L 21/67207; B08B 5/04; B08B 15/023
See application file for complete search history.

(56) References Cited

U.S. PATENT DOCUMENTS

| | | | | |
|---|---|---|---|---|
| 5,820,641 A | * | 10/1998 | Gu ...................... | B01D 5/0036 55/434.4 |
| 2009/0107091 A1 | * | 4/2009 | Cho .................... | C23C 16/4412 55/434.2 |
| 2009/0191109 A1 | * | 7/2009 | Tsuda ................. | C23C 16/4412 423/240 R |

(Continued)

FOREIGN PATENT DOCUMENTS

| | | |
|---|---|---|
| KR | 100564272 B1 | 3/2006 |
| KR | 100717837 B1 | 5/2007 |

(Continued)

*Primary Examiner* — Dung H Bui
(74) *Attorney, Agent, or Firm* — Rabin & Berdo, P.C.

(57) ABSTRACT

The apparatus for collecting by-products of the present disclosure includes: a cylindrical housing that has a top plate having a gas inlet and a bottom plate having a gas outlet extending and protruding inside the housing, and receives and then discharges an exhaust gas flowing inside; and a flow path change-type vertical internal collection tower that is installed in a hanging state inside the housing and includes a disc type collector, a diffusion plate, a cylindrical collector, and a cylindrical filter collector for collecting by-products in an exhaust gas flowing inside.

10 Claims, 6 Drawing Sheets

(56) References Cited

U.S. PATENT DOCUMENTS

| | | | |
|---|---|---|---|
| 2010/0166630 A1* | 7/2010 | Gu | B01F 5/0693 |
| | | | 423/215.5 |
| 2019/0194804 A1* | 6/2019 | Cho | H01L 21/67098 |
| 2020/0164296 A1* | 5/2020 | Cho | B01D 45/16 |
| 2020/0217559 A1* | 7/2020 | Hwang | H01L 21/67017 |
| 2020/0321226 A1* | 10/2020 | Cho | C23C 16/14 |

FOREIGN PATENT DOCUMENTS

| KR | 100862684 B1 | 10/2008 |
|---|---|---|
| KR | 1020100109762 A | 10/2010 |
| KR | 1020130074526 A | 7/2013 |
| KR | 101447629 B1 | 10/2014 |
| KR | 101806480 B1 | 1/2018 |
| KR | 1020190075627 A | 7/2019 |

* cited by examiner

APPARATUS FOR COLLECTING BY-PRODUCT OF SEMICONDUCTOR MANUFACTURING PROCESS

CROSS-REFERENCE TO RELATED APPLICATIONS

This application claims the priority of Korean Patent Application No. 10-2019-0096584 filed on Aug. 8, 2019, in the Korean Intellectual Property Office, the disclosure of which is incorporated herein by reference.

BACKGROUND

Field

The present disclosure relates to an apparatus for collecting by-products of a semiconductor manufacturing process and, more particularly, to an apparatus for collecting secondary by-products, the apparatus being disposed at a rear end of a by-product collection apparatus for collecting by-products contained in an exhaust gas discharged from a process chamber for manufacturing a semiconductor, and being able to remove a small amount of non-collected by-products remaining in the exhaust gas with by-products primarily removed.

Description of the Related Art

In general, a semiconductor manufacturing process is composed of a pre-process (fabrication process) and a post-process (assembly process) in a broad meaning.

The pre-process refers to a semiconductor chip manufacturing process of forming a specific pattern by repeatedly performing a process of depositing a thin film on a wafer in various process chambers and selectively etching the deposited thin film.

Further, the post-process refers to a package process of individually cutting and separating the chips manufactured on the wafer in the pre-process and then combining the chips with lead frames, thereby assembling the chips into complete products.

In more detail, the pre-process refers to a process of depositing a thin film on a wafer or etching a thin film deposited on a wafer. To this end, a thin film depositing process is performed by selectively injecting any one of reaction gases such as $SiH_4$ (silane), arsine, boron chloride, hydrogen, $WF_6$ (tungsten hexafluoride), $TiCl_4$ (titanium tetrachloride), and $NH_3$ (ammonia) into a process chamber, depending on processes. In this case, a large amount of various ignitable gases and noxious gases containing corrosive foreign substances and noxious components are produced in the process chamber.

In order to purify and discharge such noxious gases, semiconductor manufacturing equipment is equipped with a vacuum pump that makes a process chamber vacuum, and a scrubber that purifies an exhaust gas discharged from the process chamber and then discharges the exhaust gas to the atmosphere at the rear end of the vacuum pump.

However, the scrubber purifies and processes only gaseous by-products, when by-products solidify after discharged out of a process chamber, several problems are caused, for example, the by-products increase exhaust pressure by sticking in an exhaust line or cause breakdown of a pump by entering a vacuum pump, or noxious gases contaminate a wafer by flowing backward to the process chamber.

Accordingly, semiconductor manufacturing equipment is configured to concentrate an exhaust gas that is discharged from a process chamber by installing an apparatus for collecting by-products between the process chamber and a vacuum pump.

Such an apparatus for collecting by-products is connected with a process chamber and a vacuum pump through a pumping line and concentrates and collects particulate by-products contained in an exhaust gas discharged after reaction from the process chamber.

However, as client companies change their processes and the amount of reaction gas increases, it is difficult to completely remove by-products using only such an apparatus for collecting by-products described above. Accordingly, there is a problem in that non-collected particulate by-products may remain in a discharged exhaust gas and damage a vacuum pump.

PRIOR ART DOCUMENT

Patent Document (Patent Document 1) Korean Patent No. 10-0717837 (2007 May 7)
(Patent Document 2) Korean Patent No. 10-0862684 (2008 Oct. 2)
(Patent Document 3) Korean Patent No. 10-1447629 (2014 Sep. 29)
(Patent Document 4) Korean Patent No. 10-1806480 (2017 Dec. 1)

SUMMARY

In order to solve the problems described above, an object to be achieved by the present disclosure is to provide an apparatus for collecting by-products that is installed between a primary by-product collection apparatus and a vacuum pump in a semiconductor manufacturing process, and includes a diffusion plate positioned at a center portion, a disc type collector positioned at an upper portion, and a cylindrical collector and a cylindrical filter collector positioned at a lower portion to remove again non-collected by-products contained in an exhaust gas discharged from the primary by-product collection apparatus in a previous process, whereby a flow path of the exhaust gas is changed such that the exhaust gas has sufficient time and multi-collection process for collecting by-products while flowing a long path.

In order to achieve the objects and remove the problems in the related art, the present disclosure provides an apparatus for collecting by-products that collects again non-collected by-products, which are contained in an exhaust gas that has passed through a primary by-product collection apparatus collecting by-products of an exhaust gas discharged from a process chamber for a semiconductor process, and supplies the exhaust gas to a vacuum pump.

The apparatus for collecting by-products includes: a cylindrical housing that has a top plate having a gas inlet and a bottom plate having a gas outlet extending and protruding inside the housing, and receives and then discharges an exhaust gas flowing inside; and a flow path change-type vertical internal collection tower that is installed in a hanging state inside the housing and collects by-products of an exhaust gas flowing insides.

The flow path change-type vertical internal collection tower includes: a disc type collector that is installed to be spaced apart from the top plate of the housing with a predetermined gap therebetween, includes a plurality of disc plates arranged up and down in multiple stages, and collects by-products while supplying an exhaust gas downward; a diffusion plate that collects by-products while laterally supplying the exhaust gas supplied downward through the disc type collector; a cylindrical collector that collects by-products while supplying downward the laterally distributed exhaust gas, and then receives the exhaust gas through an opening at a lower portion thereof; and a cylindrical filter collector that is positioned in the cylindrical collector, is installed to surround an upper portion of a gas discharger, and finally collects by-products.

As a preferred embodiment, the plurality of disc plates spaced up and down with predetermined gaps therebetween of the disc type collector may be welded in multiple stages by spacer rods, and a plurality of gas holes having the same size may be formed at each of the disc plates.

As a preferred embodiment, the gas holes of upper disc plates may be larger than the gas holes of lower disc plates.

As a preferred embodiment, the gas holes of each of the disc plates and the gas holes of disc plates that are adjacent up and down may be alternately formed rather than being aligned.

As a preferred embodiment, the diffusion plate may include a blocking disc that blocks downward flow of an exhaust gas, and a plurality of guide plates radially arranged on a top surface of the blocking disc and laterally distributing flow of an exhaust gas.

As a preferred embodiment, the blocking disc may be configured to have a top surface integrally being welded to the spacer rods of the disc type collector and a bottom surface integrally welded to an upper portion of a cylinder of the cylindrical collector and a top surface of the cylindrical filter collector.

As a preferred embodiment, the guide plates may have a length smaller than a radius of the blocking disc, may have a lower end that is flat and an upper end that is inclined to gradually increase in size toward an edge from a center point of the blocking disc, and may be arranged such that an installation start point is positioned at a predetermined distance from the center of the blocking disc and an end point is positioned to be ended in an inner point at a predetermined distance from the edge of the blocking disc.

As a preferred embodiment, the cylindrical collector may include: a cylinder that allows an exhaust gas to be supplied downward only to an opening at a lower portion thereof while preventing lateral inflow of the exhaust gas; and a plurality of ring plates welded to the cylinder to be arranged up and down in multiple stages with predetermined gaps therebetween around the cylinder.

As a preferred embodiment, the ring plates each may have a plurality of gas holes circumferentially arranged.

As a preferred embodiment, the cylindrical filter collector may be welded to a bottom surface of the diffusion plate, may be positioned inside the cylindrical collector, may be installed such that a predetermined lower section surrounds a space around an upper portion of a gas discharger, and may have a plurality of gas holes circumferentially arranged to collect by-products by inducing inflow of an exhaust gas.

As a preferred embodiment, an inner diameter of the cylindrical filter collector is made larger than an outer diameter of the gas outlet, and an outer diameter of the cylindrical filter collector is made smaller than an inner diameter of the cylinder of the cylindrical collector, whereby a space through which an exhaust gas can move may be formed.

The apparatus for collecting by-products having the above characteristics according to the present disclosure is installed between a primary by-product collection apparatus and a vacuum pump in a semiconductor manufacturing process, and includes a diffusion plate positioned at a center portion, a disc type collector positioned at an upper portion, and a cylindrical collector and a cylindrical filter collector positioned at a lower portion to remove again non-collected by-products contained in an exhaust gas discharged from the primary by-product collection apparatus in a previous process, whereby a flow path of the exhaust gas is changed such that the exhaust gas has sufficient time and multi-collection process for collecting by-products while flowing a long path. Accordingly, the present disclosure is an invention that has an effect of being able to prevent damage to a vacuum pump due to by-products and that is expected to be widely used in industry.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Hereafter, configuration and operation that are embodiments of the present disclosure are described in detail with reference to the accompanying drawings. Further, in describing the present disclosure, detailed descriptions of well-known functions or configurations relating to the present disclosure will not be provided so as not to obscure the description of the present disclosure with unnecessary details.

Figure 1:
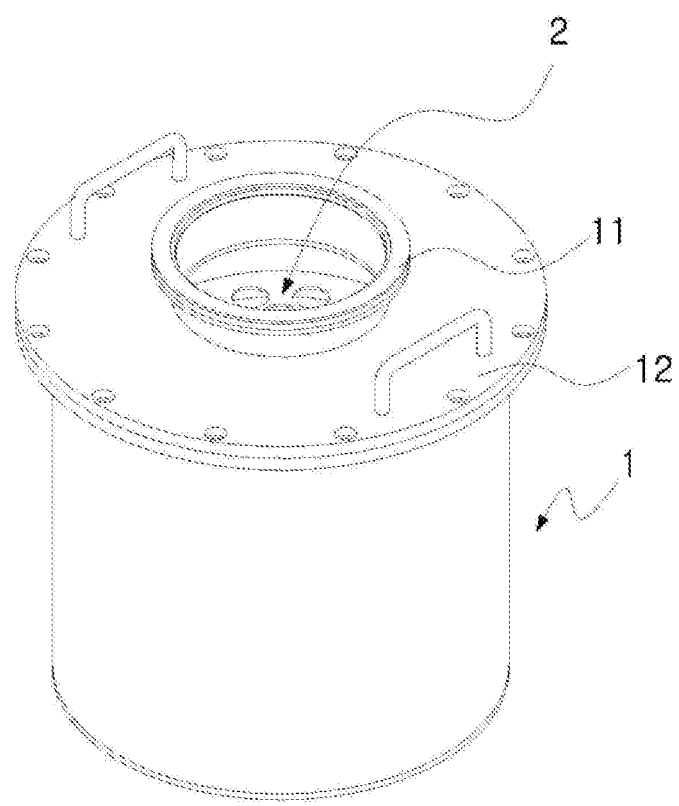
FIG. 1 is a perspective view of an apparatus for collecting by-products according to an embodiment of the present disclosure.
Figure 2:
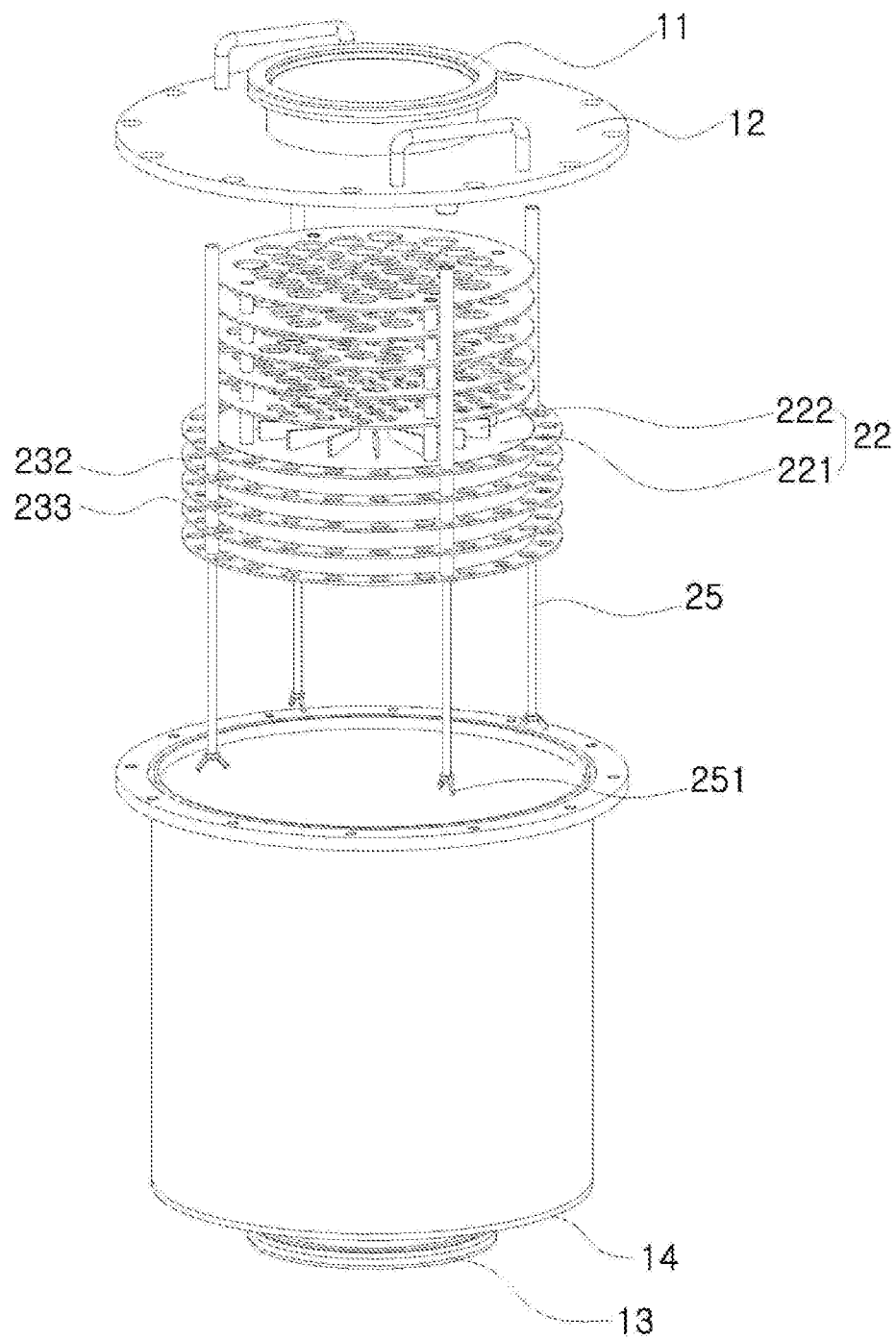
FIG. 2 is an exploded perspective view of the apparatus for collecting by-products according to an embodiment of the present disclosure.
Figure 3:
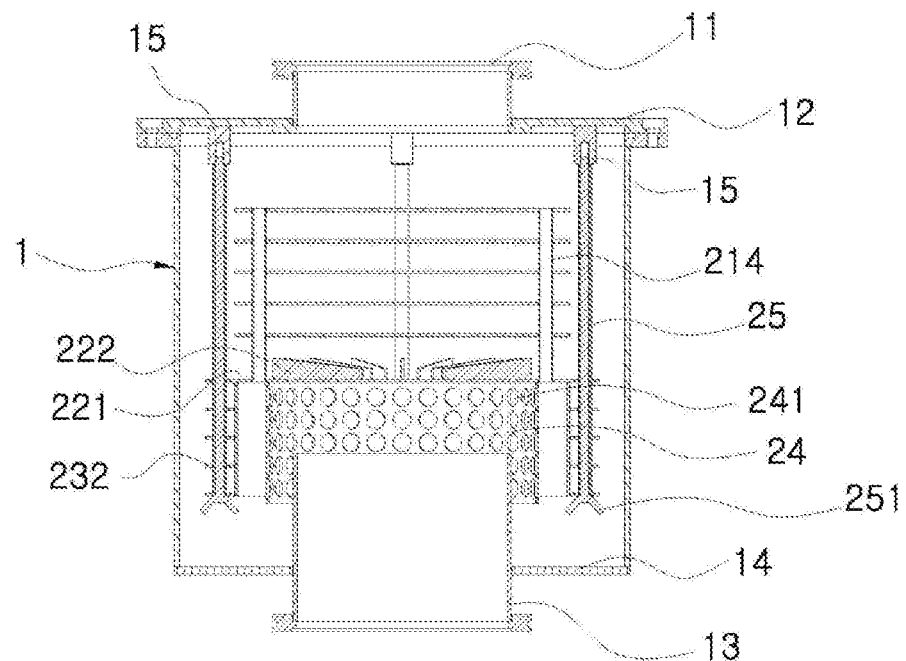
FIG. 3 is a cross-sectional view of an apparatus for collecting by-products according to an embodiment of the present disclosure.
Figure 4:
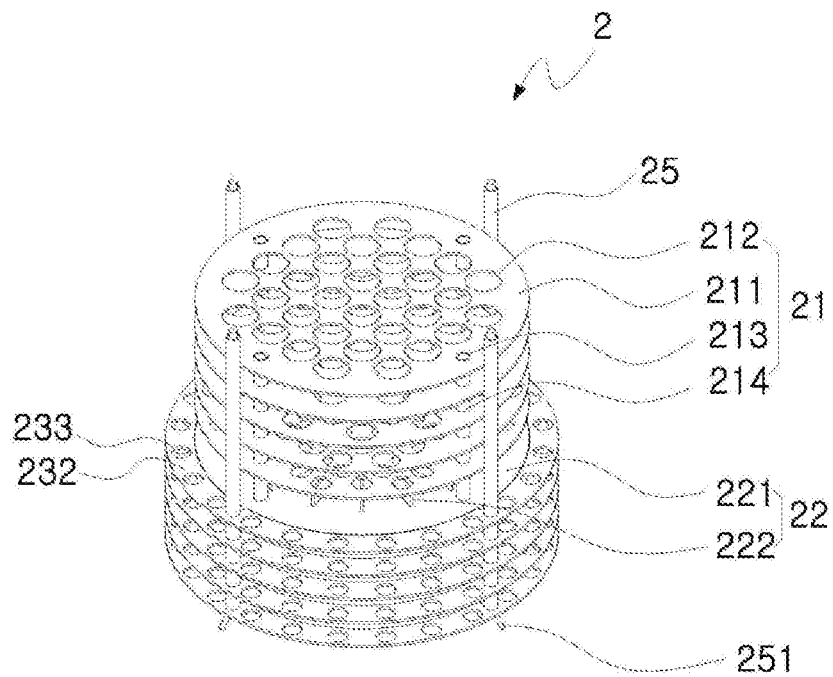
FIG. 4 is an entire configuration view of a flow path change-type vertical internal collection tower according to an embodiment of the present disclosure.
Figure 5:
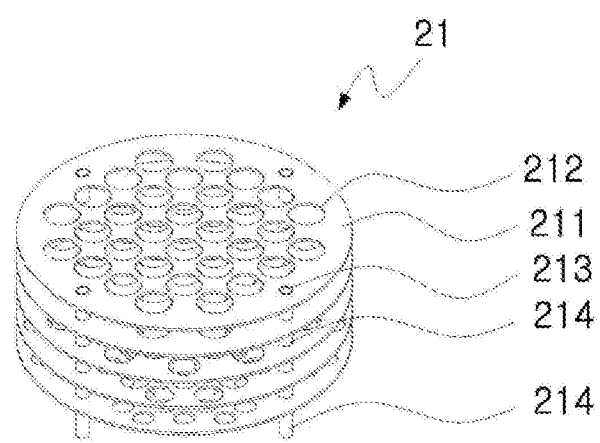
FIG. 5 is a configuration view of a disc type collector according to an embodiment of the present disclosure.
Figure 6:
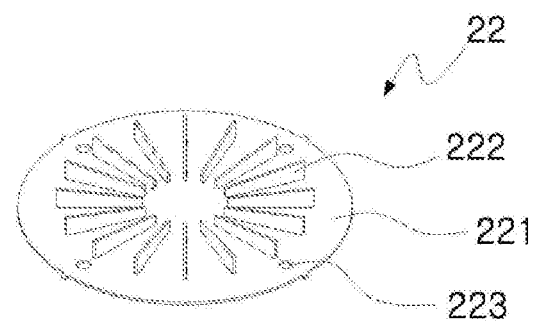
FIG. 6 is a configuration view of a diffusion plate according to an embodiment of the present disclosure.
Figure 7:
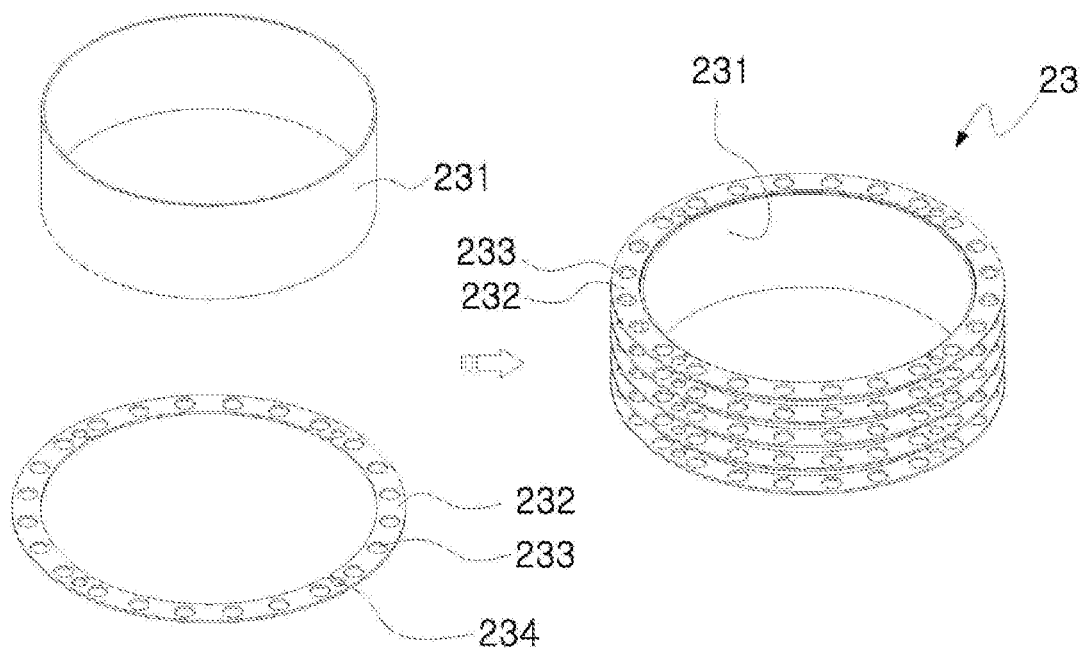
FIG. 7 is a configuration view of a cylindrical collector according to an embodiment of the present disclosure.
Figure 8:
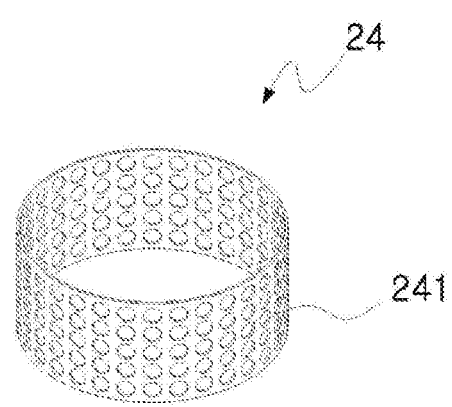
FIG. 8 is a configuration view of a cylindrical filter collector according to an embodiment of the present disclosure.

FIG. 1 is a perspective view of an apparatus for collecting by-products according to an embodiment of the present disclosure, FIG. 2 is an exploded perspective view of the apparatus for collecting by-products according to an embodiment of the present disclosure, FIG. 3 is a front cross-sectional view of an apparatus for collecting by-products according to an embodiment of the present disclosure, FIG. 4 is an entire configuration view of a flow path change-type vertical internal collection tower according to an embodiment of the present disclosure, FIG. 5 is a configuration view of a disc type collector according to an embodiment of the present disclosure, FIG. 6 is a configuration view of a diffusion plate according to an embodiment of the present disclosure, FIG. 7 is a configuration view of a cylindrical collector according to an embodiment of the present disclosure, and FIG. is a configuration view of a cylindrical filter collector according to an embodiment of the present disclosure.

As shown in the figures, the apparatus for collecting by-products according to the present disclosure is a secondary by-product collection apparatus installed between a primary by-product collection apparatus and a vacuum pump in a semiconductor manufacturing process of a semiconductor process, particularly, an apparatus that has a compact structure to be installed at the upper end of a vacuum pump and removes again non-collected by-products contained in an exhaust gas discharged from the primary by-product collection apparatus to prevent breakdown of the vacuum pump. In particular, the apparatus for collecting by-products is configured to concentrate and collect particulate substances in noxious gases included in the components of an exhaust gas, which is gas discharged after a thin film deposition process such as $TiCl_4$ (titanium tetrachloride) and $NH_3$ (ammonia) that are used as a process gas in a process chamber performing TiN-ALD and CVD processes, as by-product through a primary by-product collection apparatus, to collect again non-reacted or non-collected by-products contained in the discharged exhaust gas, and finally to supply the by-products to a vacuum pump.

The configuration of an apparatus for collecting by-products according to the present disclosure largely includes: a housing 1; and a flow path change-type vertical internal collection tower 2 installed in a hanging state inside the housing 1 and collecting by-products from an exhaust gas flowing inside.

The housing 1 is configured in a cylindrical shape, has a top plate 12 having a gas inlet 11 at the top and a bottom plate 14 having a gas outlet 13 protruding and extending inside the housing 1 at a lower portion thereof to discharge an exhaust gas with by-products removed, thereby receiving and then discharging an exhaust gas flowing inside.

The gas inlet formed at the top plate 12 has a shape protruding upward without extending and protruding downward inside the housing 1 such that an exhaust gas flowing inside is uniformly supplied laterally toward a disc type collector to be described below and the inner side wall of the housing 1.

Further, the top plate 12 has a plurality of fastening portion 15 protruding and circumferentially arranged on the bottom surface, and upper ends of load support rods 25 that support the load of the flow path change-type vertical internal collection tower 2 are thread-fastened to treads formed in grooves in the fastening portions 15. By this fastening, the flow path change-type vertical internal collection tower 2 is installed in a hanging state.

The gas outlet 13 formed at the bottom plate 14 has a configuration of which the height extends by not only protruding outward, but also protruding inside the housing 1. The reason of forming this configuration is for increasing the amount of substances collected in a cylindrical collector 23 and a cylindrical filter collector 24, which are described below, and preventing or reducing of direct leakage of the collected substances to a vacuum pump by generating vortexes around the bottom plate 14 of the housing 1 and the gas outlet 13 having an extending height.

The flow path change-type vertical internal collection tower 2 largely includes a disc type collector 21, a diffusion plate 22, a cylindrical collector 23, a cylindrical filter collector 24, and load support rods 25.

The disc type collector 21 includes a plurality of disc plates 211 spaced up and down apart from each other with predetermined gaps in multiple stages, is positioned at an upper portion spaced apart from the top plate 12 with a predetermined gap therebetween in the housing 1, and supplies an exhaust gas, which flows inside through the gas inlet, vertically downward in multiple stages to collect by-products in multiple stages through the disc plates 211 having gas holes 212 formed on the surfaces.

In the disc type collector 21, other than the gas holes 212, a plurality of fastening holes 213 is formed on the surface and circumferentially arranged along the edge of each of the disc plates 211 to space up and down the disc plates 211 with predetermined gaps therebetween. Further, the disc type collector 21 includes a plurality of spacer rods 214 vertically disposed through the fastening holes 213 of the disc plates 211.

The spacer rods 214 are inserted through the fastening holes 213 of the disc plates 211 and then welded, thereby fixing the disc plates 211 with the predetermined gaps maintained between the disc plates 211 adjacent up and down to each other.

Since the disc plates 211 each have a plurality of gas holes 212 arranged with the same sizes, so an exhaust gas flowing inside is supplied to downwardly adjacent disc plates 211. Further, by-products are smoothly collected around the edge due to the gas holes 212.

In the plurality of disc plates 211 spaced up and down apart from each other with predetermined gaps therebetween, the gas holes 212 of upper disc plates 211 are formed larger than the gas holes 212 of lower disc plates 211. That is, upper ones are formed proportionally larger than the lower ones. The sizes of the gas holes 212 may depend on the number of the disc plates 211 and the size or the number of specific gas holes 212 is not limited in the present disclosure.

If the upper and lower gas holes 212 have the same size or upper gas holes 212 are formed smaller, the flow of an exhaust gas slows down and a lot of by-products are collected to upper disc plates 211, so upper gas holes 212 may be clogged first. Accordingly, the reason of the above configuration is for preventing this problem by forming upper gas holes 212 larger than lower gas holes 212 so that an exhaust gas is smoothly supplied downward without delay of supply flow and accordingly by-products are uniformly collected to the respective disc plates 211.

Further, in the plurality of disc plates 211 spaced up and down with predetermined gaps therebetween, the gas holes 212 of each of the disc plates 211 and the gas holes 212 of disc plates 211 that are adjacent up and down are alternately formed rather than being aligned. If the gas holes 212 that are adjacent up and down to each other are vertically aligned, an exhaust gas flows through the gas holes 212 along paths of the shortest distance without coming in contact with the entire surfaces of the disc plates 211, so the efficiency of collecting by-products may be deteriorated. However, for this reason, according to the present disclosure, the gas holes 212 are alternately formed, so the contact areas of an exhaust gas and the disc plates 211 are increased and the efficiency of collecting by-products is increased.

The diffusion plate 22 includes a blocking disc 221 that blocks the downward flow of an exhaust gas, and a plurality of guide plates 222 radially arranged on the top surface of the blocking disc 221 and laterally distributing the flow of an exhaust gas.

The diffusion plate 22 is installed to be spaced a predetermined gap apart from the lowermost disc plate 211 of the disc type collector 21, whereby it prevents an exhaust gas supplied downward from flowing downward and guides the exhaust gas laterally toward the inner wall of the housing 1 by radially distributing the flow paths of the exhaust gas at predetermined angles.

Further, the exhaust gas comes in contact with the surface of the diffusion plate 22, so the diffusion plate 22 also serves to collect by-products.

Further, the lower portions of the spacer rods 214 integrated by welding to the multi-state disc plates 211 of the disc type collector 21 are integrated to the top surface of the blocking disc 221 of the diffusion plate 22 by welding. To this end, the fastening holes 223 are circumferentially arranged outside the blocking disc 221.

Further, the blocking disc 221 of the diffusion plate 22 is welded at the bottom surface to the upper portion of the cylinder of the cylindrical collector 23 to be described below, thereby being integrated simultaneously with blocking the path of an exhaust gas flowing into the cylindrical collector 23.

Further, the blocking disc 221 of the diffusion plate 22 is integrated by welding to the top surface of the cylindrical filter collector 24 to be described below.

The guide plates 222 have a length smaller than the radius of the blocking disc 221 and are welded in an erect position, in detail, are machined such that the lower end is flat and the upper end is inclined to gradually increase in size toward the edge from the center point of the blocking disc 221. When the guide plates 222 having this shape are radially welded on the top surface of the blocking disc 221, an exhaust gas is guided more uniformly and farther when the exhaust gas supplied downward from the disc type collector 21 hits the center portion of the blocking disc 221 and then laterally flows toward the inner wall of the housing 1.

Further, when the plurality of guide plates 222 is radially installed, they are arranged and welded such that the start point is positioned at a predetermined distance from the center of the blocking disc 221 and the end point is positioned in an inner point at a predetermined distance from the edge of the blocking disc 221. In order to more quickly radially weld the guide plates 222 to the blocking disc 221 at accurate angles, grooves may be radially formed in advance on the blocking disc 221 and steps corresponding thereto may be formed at the lower ends of the guide plates 222 to be fitted and welded in the grooves.

The cylindrical collector 23 includes a cylinder 231 that allows an exhaust gas to be supplied downward only to an opening at the lower portion while preventing lateral inflow of the exhaust gas, and a plurality of ring plates 232 arranged up and down in multiple stages with predetermined gaps therebetween around the cylinder 231. The ring plates 232 are fixed to the circumference of the cylinder 231 by welding.

The upper portion of the cylinder 231 of the cylindrical collector 23 having this configuration is closed, so the exhaust gas radially and laterally flowing toward the inner wall of the housing 1 by the diffusion plate 22 preventing vertical inflow of the exhaust gas is guided downward through a space formed by the inner wall of the housing 1 and the cylinder 231, whereby by-products are collected through the ring plates 232.

The cylinder 231 has an open top and bottom and has an outer diameter smaller than the inner diameter of the housing 1, but the top is closed by being welded to the blocking disc 221 of the diffusion plate 22, so only the bottom is open.

The ring plates 232 are ring-structural plates having an inner diameter corresponding to the outer diameter of the cylinder 231 and an outer diameter smaller than the inner diameter of the housing 1. The ring plates 232 have a structure with a plurality of gas holes 233 circumferentially arranged to be able to pass an exhaust gas.

By-products are collected well at the edges of the gas holes 233 formed at the ring plates 232, so by-products are collected at the entire ring-plates while particulate by-products contained in an exhaust gas flowing downward are collected relatively early at the edges of the gas holes 233.

Further, other than the gas holes 233, a plurality of fastening holes 234 is formed with predetermined gaps at the ring plates 232, so the load support rods 25 are inserted vertically through fastening holes 234 of the ring plates 232 arranged up and down and then fastened to the bottom of the lowermost ring plate 232 by fastening nuts, thereby supporting load.

According to the configuration of the cylindrical collector 23 described above, an exhaust gas with the flow paths laterally changed while flowing down through the gas inlet 11 formed at the top plate 12 of the housing 1, the disc type collector 21, and the diffusion plate 22 flows down through the gas holes 233 of the ring plates 232 and the space formed by the outer circumferential portions of the ring plates 232 and the inner wall of the housing 1, whereby non-reacted substances contained in the exhaust gas are collected in the process.

The cylindrical filter collector 24 is welded to the bottom surface of the diffusion plate 22, is positioned inside the cylindrical collector 23, and has a structure of which a predetermined lower section surrounds a space around the upper portion of a gas discharger and that has a plurality of gas holes 241 circumferentially arranged to induce inflow of an exhaust gas. Since by-products are collected well at the edges of the gas holes, the gas holes finally collect and filter out non-reacting by-products before an exhaust gas is discharged to the gas outlet 13 by inducing flow of the exhaust gas.

The inner diameter of the cylindrical filter collector 24 is made larger than the outer diameter of the gas outlet 13, thereby forming a space therebetween through which an exhaust gas can move. Further, the outer diameter of the cylindrical filter collector 24 is made smaller than the inner diameter of the cylinder 231 of the cylindrical collector 23, thereby forming a space therebetween through which an exhaust gas can move.

The load support rods 25 are rods having threads around a predetermined section at the upper and lower ends, and four load support rods are provided in an embodiment of the present disclosure and support load by stably supporting the cylindrical collector 23. As the cylindrical collector is supported in this way, even the load of the disc type collector 21, the diffusion plate 22, and the cylindrical filter collector 24 integrally connected with the load support rods is supported, so they are installed in the state hanging on the top plate of the housing.

The upper ends of the load support rods 25 are thread-fastened to the fastening portions 15 circumferentially formed on the top plate 12 and the lower ends thereof are fastened to the bottom of the lowermost ring plate 232 by fastening nuts 251 after passing through the ring plates 232 arranged in multiple stages, thereby supporting the load. The fastening nuts, for example, may be nuts having a structure with a V-shape on the bottom to prevent pulling-out. The fastening nuts may be configured to be selectively integrated with the lower ends of the load support rods or may be configured to be individually detachably fastened.

Further, the load support rods 25, for example, may be stud bolts having threads throughout the circumference of rods. Alternatively, the load support rods may be stud bolts having a metal casing being strong against an exhaust gas on the outer side and having threads throughout the inner side of the rod so that the outer sides of the stud bolts are protected and the durability is increased.

Figure 9:
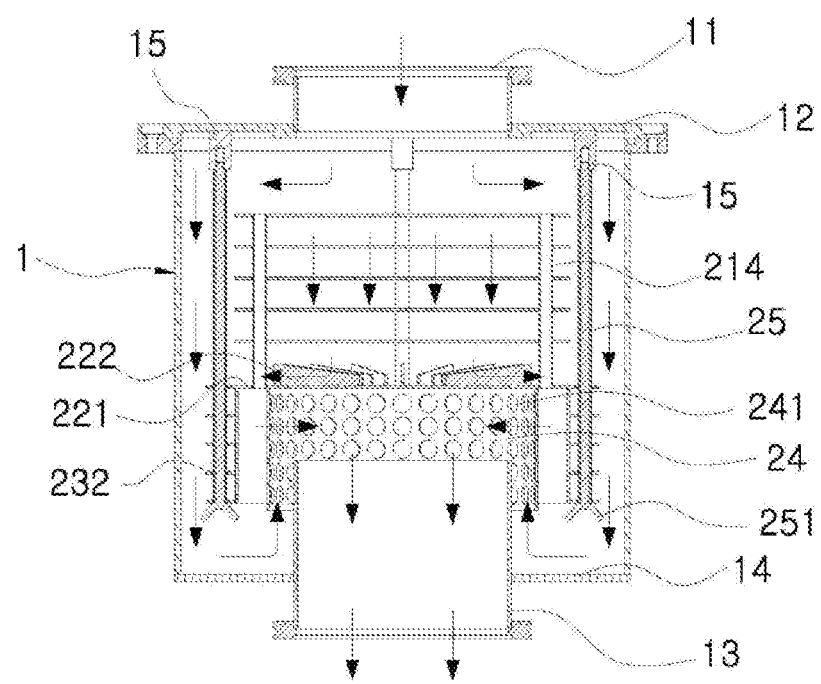
FIG. 9 is a view showing the flow of an exhaust gas in an apparatus for collecting by-products according to an embodiment of the present disclosure.

FIG. 9 is a view showing the flow of an exhaust gas in an apparatus for collecting by-products according to an embodiment of the present disclosure.

As for the flow of an exhaust gas flowing in the apparatus for collecting by-products, as shown in the figure, an exhaust gas discharged from a by-product collection apparatus, which primarily collects by-products in the previous process, flows into the housing 1 through the gas inlet 11 formed at the top plate 12 of the housing 1. Thereafter, by-products are collected again from the exhaust gas containing non-collected by-products while some of the exhaust gas flows down through the disc type collector 21 and passes in multiple stages through the disc plates 211 having gas holes on the surfaces of the disc type collector 21, and the other of the exhaust gas laterally flows toward the inner wall of the housing 1 and then flows down.

Thereafter, the exhaust gas no more flows down by hitting the blocking disc 221 of the diffusion plate 22 and the flow path is radially distributed by the guide plates 222, whereby the exhaust gas laterally flows toward the inner wall of the housing with the flow path changed.

Thereafter, the exhaust gas with the flow path changed flows down through the gas holes of the ring plates 232 arranged up and down in multiple stages around the cylinder 231 of the cylindrical collector 23 and through the space formed between the outer circumferential portions of the ring plates 232 and the inner wall of the housing 1, whereby non-reacted substances in the exhaust gas are collected in this process.

Thereafter, the exhaust gas flows into the lower portion of the cylinder 231 of the cylindrical collector 23 and then flows up along the gas outlet 13 protruding inside the housing 1. Since the gas outlet 13 has a shape with the height extending from the bottom plate 14, the exhaust gas flows up while forming vortexes around the gas outlet 13. The exhaust gas flowing up is guided to the gas holes formed through the circumference of the cylindrical filter collector 24 and by-products are collected, thereby undergoing a final filtering process.

Thereafter, the exhaust gas flows down through the gas outlet 13 and is then discharged to a vacuum pump connected to the lower end of the gas outlet 13.

The present disclosure is not limited to the specific embodiments and may be modified in various ways without departing from the scope of the present disclosure described in claims by those skilled in the art, and the modifications are included in the scope of the present disclosure.

What is claimed is:

1. An apparatus for collecting by-products that collects again non-collected by-products, which are contained in an exhaust gas that has passed through a primary by-product collection apparatus collecting by-products of an exhaust gas discharged from a process chamber for a semiconductor process, and supplies the exhaust gas to a vacuum pump, the apparatus for collecting by-products comprising:

a cylindrical housing that has a top plate having a gas inlet and a bottom plate having a gas outlet extending and protruding inside the housing, and receives and then discharges an exhaust gas flowing inside; and a flow path change-type vertical internal collection tower that is installed in a hanging state inside the housing and collects by-products of an exhaust gas flowing insides, wherein the flow path change-type vertical internal collection tower includes: a disc type collector that is installed to be spaced apart from the top plate of the housing with a predetermined gap therebetween, includes a plurality of disc plates arranged up and down in multiple stages, and collects by-products while supplying an exhaust gas downward; a diffusion plate that collects by-products while laterally supplying the exhaust gas supplied downward through the disc type collector; a cylindrical collector that collects by-products while supplying downward the laterally distributed exhaust gas, and then receives the exhaust gas through an opening at a lower portion thereof; and a cylindrical filter collector that is positioned in the cylindrical collector, is installed to surround an upper portion of the gas outlet, and finally collects by-products, wherein the cylindrical collector includes a cylinder that allows an exhaust gas to be supplied downward only to an opening at a lower portion thereof while preventing lateral inflow of the exhaust gas, and a plurality of ring plates welded to the cylinder to be arranged up and down in multiple stages with predetermined gaps therebetween around the cylinder.

2. The apparatus for collecting by-products of claim 1, wherein the plurality of disc plates spaced up and down with predetermined gaps therebetween of the disc type collector is welded in multiple stages by spacer rods, and a plurality of gas holes having the same size are formed at each of the disc plates.

3. The apparatus for collecting by-products of claim 2, wherein the gas holes of upper disc plates are larger than the gas holes of lower disc plates.

4. The apparatus for collecting by-products of claim 2, wherein the gas holes of each of the disc plates and the gas holes of disc plates that are adjacent up and down are alternately formed rather than being aligned.

5. The apparatus for collecting by-products of claim 1, wherein the diffusion plate includes a blocking disc that blocks downward flow of an exhaust gas, and a plurality of guide plates radially arranged on a top surface of the blocking disc and laterally distributing flow of the exhaust gas.

6. The apparatus for collecting by-products of claim 5, wherein the blocking disc has a top surface integrally being welded to spacer rods of the disc type collector and a bottom surface integrally welded to an upper portion of a cylinder of the cylindrical collector and a top surface of the cylindrical filter collector.

7. The apparatus for collecting by-products of claim 1, wherein the ring plates each have a plurality of gas holes circumferentially arranged.

8. The apparatus for collecting by-products of claim 1, wherein the cylindrical filter collector is welded to a bottom surface of the diffusion plate, is positioned inside the cylindrical collector, is installed such that a predetermined lower section surrounds a space around an upper portion of the gas outlet, and has a plurality of gas holes circumferentially arranged to collect by-products by inducing inflow of an exhaust gas.

9. The apparatus for collecting by-products of claim 8, wherein an inner diameter of the cylindrical filter collector is made larger than an outer diameter of the gas outlet, and an outer diameter of the cylindrical filter collector is made smaller than an inner diameter of the cylinder of the cylindrical collector, whereby a space through which an exhaust gas can move is formed.

10. An apparatus for collecting by-products that collects again non-collected by-products, which are contained in an exhaust gas that has passed through a primary by-product collection apparatus collecting by-products of an exhaust gas discharged from a process chamber for a semiconductor process, and supplies the exhaust gas to a vacuum pump, the apparatus for collecting by-products comprising:

a cylindrical housing that has a top plate having a gas inlet and a bottom plate having a gas outlet extending and protruding inside the housing, and receives and then discharges an exhaust gas flowing inside; and a flow path change-type vertical internal collection tower that is installed in a hanging state inside the housing and collects by-products of an exhaust gas flowing insides, wherein the flow path change-type vertical internal collection tower includes: a disc type collector that is installed to be spaced apart from the top plate of the housing with a predetermined gap therebetween, includes a plurality of disc plates arranged up and down in multiple stages, and collects by-products while supplying an exhaust gas downward; a diffusion plate that collects by-products while laterally supplying the exhaust gas supplied downward through the disc type collector; a cylindrical collector that collects by-products while supplying downward the laterally distributed exhaust gas, and then receives the exhaust gas through an opening at a lower portion thereof; and a cylindrical filter collector that is positioned in the cylindrical collector, is installed to surround an upper portion of the gas outlet, and finally collects by-products, wherein the diffusion plate includes a blocking disc that blocks downward flow of an exhaust gas, and a plurality of guide plates radially arranged on a top surface of the blocking disc and laterally distributing flow of the exhaust gas, wherein the guide plates have a length smaller than a radius of the blocking disc, have a lower end that is flat and an upper end that is inclined to gradually increase in size toward an edge from a center point of the blocking disc, and are arranged such that an installation start point is positioned at a predetermined distance from the center of the blocking disc and an end point is positioned in an inner point at a predetermined distance from the edge of the blocking disc.

* * * * *